(12) United States Patent
Peugh et al.

(10) Patent No.: US 7,551,439 B2
(45) Date of Patent: Jun. 23, 2009

(54) FLUID COOLED ELECTRONIC ASSEMBLY

(75) Inventors: Darrel E. Peugh, Kokomo, IN (US);
Bruce A. Myers, Kokomo, IN (US);
Gary E. Oberlin, Windfall, IN (US)

(73) Assignee: Delphi Technologies, Inc., Troy, MI (US)

( * ) Notice: Subject to any disclaimer, the term of this patent is extended or adjusted under 35 U.S.C. 154(b) by 123 days.

(21) Appl. No.: 11/396,322

(22) Filed: Mar. 28, 2006

(65) Prior Publication Data
US 2007/0230127 A1 Oct. 4, 2007

(51) Int. Cl.
*H05K 7/20* (2006.01)
(52) U.S. Cl. .................. 361/699; 165/80.4; 174/15.1; 257/714; 62/259.2
(58) Field of Classification Search ............... 361/689, 361/699, 700, 717, 719; 257/724, E23.092, 257/E23.098; 165/80.4, 104.33, 104.21, 165/168, 170, 134.1; 174/15.1, 252; 62/64, 62/171, 259.2
See application file for complete search history.

(56) References Cited

U.S. PATENT DOCUMENTS

| | | | | |
|---|---|---|---|---|
| 5,183,104 | A * | 2/1993 | Novotny | 165/104.33 |
| 5,220,804 | A * | 6/1993 | Tilton et al. | 62/64 |
| 5,262,921 | A * | 11/1993 | Lamers | 361/699 |
| 5,316,075 | A * | 5/1994 | Quon et al. | 165/80.4 |
| 5,841,634 | A * | 11/1998 | Visser | 361/699 |
| 5,901,037 | A * | 5/1999 | Hamilton et al. | 361/699 |
| 6,349,760 | B1 * | 2/2002 | Budelman | 165/80.4 |
| 6,367,543 | B1 * | 4/2002 | Calaman et al. | 165/80.4 |
| 6,473,303 | B2 * | 10/2002 | Kaufmann | 361/699 |
| 6,498,725 | B2 * | 12/2002 | Cole et al. | 361/700 |
| 6,578,626 | B1 * | 6/2003 | Calaman et al. | 165/80.4 |
| 6,612,120 | B2 * | 9/2003 | Patel et al. | 62/171 |
| 6,639,798 | B1 | 10/2003 | Jeter et al. | |
| 6,719,039 | B2 * | 4/2004 | Calaman et al. | 165/80.4 |
| 6,840,308 | B2 * | 1/2005 | Ritter et al. | 165/80.4 |
| 6,892,762 | B2 * | 5/2005 | Porter et al. | 137/884 |
| 6,919,231 | B1 | 7/2005 | Ramanathan et al. | |
| 6,952,346 | B2 * | 10/2005 | Tilton et al. | 62/64 |

(Continued)

FOREIGN PATENT DOCUMENTS

EP 0715352 6/1996

(Continued)

OTHER PUBLICATIONS

EP Search Report dated Aug. 1, 2007.

*Primary Examiner*—Jayprakash N Gandhi
*Assistant Examiner*—Courtney Smith
(74) *Attorney, Agent, or Firm*—Jimmy L. Funke (57) ABSTRACT

An electronic assembly is provided having a thermal cooling fluid, such as a liquid, for cooling an electronic device within a sealed compartment. The assembly includes a housing generally defining a sealed fluid compartment, an electronic device disposed within the housing and a cooling liquid for cooling the electronic device. The assembly includes inlet and outlet ports in fluid communication with the sealed fluid compartment for allowing the cooling liquid to pass through the compartment to cool the electronic device. Fluid flow channels are formed in thermal communication with the electronic device within the housing. The fluid channels include channels that allow liquid to flow in thermal communication with the electronic device to cool the device.

17 Claims, 5 Drawing Sheets

U.S. PATENT DOCUMENTS

| | | |
|---|---|---|
| 6,988,534 B2 * | 1/2006 | Kenny et al. ............... 165/80.4 |
| 6,988,535 B2 * | 1/2006 | Upadhya et al. ........... 165/80.4 |
| 7,017,655 B2 * | 3/2006 | Wilson et al. .............. 165/80.4 |
| 7,177,153 B2 * | 2/2007 | Radosevich et al. ......... 361/699 |
| 7,180,742 B1 | 2/2007 | Chayut |
| 7,212,407 B2 * | 5/2007 | Beihoff et al. .............. 361/699 |
| 2002/0186545 A1 * | 12/2002 | Fukada et al. .............. 361/719 |
| 2003/0151896 A1 | 8/2003 | Zeighami et al. |
| 2005/0141195 A1 | 6/2005 | Pokharna et al. |
| 2005/0185378 A1 | 8/2005 | Tilton et al. |
| 2006/0022334 A1 * | 2/2006 | Myers et al. ................ 257/724 |
| 2006/0291164 A1 * | 12/2006 | Myers et al. ................ 361/699 |
| 2007/0177352 A1 * | 8/2007 | Monfarad et al. ........... 361/699 |

FOREIGN PATENT DOCUMENTS

EP    1739746    1/2007

* cited by examiner

FLUID COOLED ELECTRONIC ASSEMBLY

TECHNICAL FIELD

The present invention generally relates to electronics assemblies and, more particularly, relates to an electronic assembly having thermal cooling fluid for cooling the electronics.

BACKGROUND OF THE INVENTION

Power electronic devices employ electronics packages (devices) that generally contain electrical circuitry for conducting electrical current which, in turn, generates thermal energy (i.e., heat). Automotive high-power electronics, such as those employed in electric and hybrid-electric vehicles typically generate a significant amount of thermal energy during operation. Excessive heat build-up may cause reduced performance including electrical circuit failure. Thus, thermal energy must be dissipated and transferred away from the electronics to ensure proper operation of the package. Additionally, the power capability of the electronics package(s) and size of the electronic assembly generally depend upon the amount of heat dissipation that may be achieved.

For very high-power applications, such as electronics packages used in hybrid-electric or electric vehicles, enhanced cooling of electronics may be required. U.S. Pat. No. 6,639,798 discloses an automotive electronics heat exchanger employing a heat sink device having a fluid vessel in fluid communication with an automotive radiator. The heat sink device is positioned in thermal communication with one side of an electronics power package such that fluid coolant flows through the heat sink device to cool the electronics package.

Some conventional assemblies employ exposed metal thermally conductive structures that connect to the die surface to conduct thermal energy waste to an external heat sink. These packages are typically molded assemblies that result in a solid structure that relies upon thermal conduction through the metal heat transfer path. These and other conventional semiconductor packages provide sufficient cooling for certain size electronic packages and applications. However, further enhanced cooling of some electronic devices is desired.

It is therefore desirable to provide for an electronic assembly that offers enhanced thermal cooling of the electronic package(s). In particular, it is desirable to provide for a fluid cooled electronic assembly that is small and cost affordable, to accommodate high-power electronic devices (e.g., packages), such as those employed in automotive vehicles.

SUMMARY OF THE INVENTION

According to one aspect of the present invention, an electronic assembly is provided having thermal cooling fluid for cooling an electronic device. The electronic assembly includes a housing generally defining a sealed fluid compartment and an electronic device disposed within the housing. The assembly also includes an inlet port in fluid communication with the sealed fluid compartment for receiving a cooling fluid. The assembly has an outlet port in fluid communication with the sealed fluid compartment for passing the coolant fluid out of the housing. The assembly further includes fluid flow channels formed in thermal communication with the electronic device within the housing. The fluid flow channels allow fluid to flow from the inlet port into fluid communication with the electronic device to cool the electronic device and out the outlet port. According to a further aspect of the present invention, the fluid flow channels are formed in at least one surface of the electronic device.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Referring to FIGS. 1-5, an electronic assembly 10 is generally illustrated according to a first embodiment of the present invention. The electronic assembly 10 includes a surface mountable electronics substrate 12, in the form of a printed circuit board, generally containing a substrate material and electrical circuitry as is known in the art. The electronic assembly 10 also includes an electronic device 20, such as a semiconductor die/device is mounted onto the top surface of the substrate 12. The electronic assembly 10 is further configured to allow for cooling fluid, more particularly, cooling liquid, to pass through the printed circuit board 12 and in thermal communication with the electronic device 20 to conduct thermal energy always from the electronic device 20.

The substrate 12 may be in the form of a printed circuit board, according to one embodiment. The substrate 12 may include an alumina substrate, according to an exemplary embodiment. According to other embodiments, the substrate 12 may be made of a low temperature co-fired ceramic (LTCC), aluminium nitride, silicon nitride and other types of ceramic, organic materials, such as FR4, a metal such as stainless steel or any other suitable material. Substrate 12 may have electrical circuitry formed on the top side surface and/or bottom side surface, as well as between laminated and intermediate layers of the substrate 12. Substrate 12 is shown configured as a board having generally planar and parallel top and bottom surfaces, according to one embodiment. Substrate 12 is also shown supported on top of a housing member 14, such as an aluminium housing.

The electronic device 20 may include any of a number of electronic devices having electrical circuitry. The electronic device 20 generates thermal energy (heat) when conducting electrical current during operation. While a single electronic housing 16 is shown mounted on substrate 12, it should be appreciated that any one or more electronic housing may be mounted onto the surface of substrate 12 and cooled by way of the fluid cooling according to the present invention.

The electronic housing 16 may include one or more semiconductor devices or packages, such as transistors configured to provide controlled switching operation, operate as a diode, provide voltage regulation or perform various other functions. The electronic device 20 may be a fabricated semiconductor chip, such as a flip chip die/device with solder bumps or wire bonded connections that are electrically and/or physically coupled to substrate 12. In one exemplary embodiment, the electronic device 20 is made of silicon that may be configured to provide cooling channels as described herein. According to other embodiments, the electronic device 20 may include a field effect transistor (FET), isolated gate bipolar transistor (IGBT), and other dual-sided electrical devices. In a high-power application, such as is common in a hybrid-electric or electric vehicle application, the electronic device 20 may include a power inverter, DC-to-DC converter or a DC-to-AC converter, according to some illustrative examples.

The electronic device 20 is shown mounted within a sealed housing 16 on top of the printed circuit board 12. The electronic device 20 may be oriented and physically and electrically connected to electrical leads in various ways according to different embodiments. In the first embodiment shown in FIGS. 1-5, the electronic device 20 is semiconductor transistor, such as a field effect transistor (FET) or an isolated gate bipolar transistor (IGBT). The semiconductor transistor is fabricated in silicon and has drain, gate and source terminals provided on the top and bottom surfaces.

The electronic device 20 is essentially encapsulated by the housing 16 within a sealed compartment. Housing 16 has a bottom wall, four side walls and further includes a cover 18 sealed thereto to form the sealed compartment. The cover 18 further has a conductive sheet 36 provided on the top surface for coefficient of thermal expansion (CTE) equalization. The upper end of side walls of housing 16 have a groove 38 for receiving a seal 28 to provide a fluid tight seal between the cover 18 and the side walls. The seal may include solder or any other suitable seal material to prevent leakage of the cooling fluid. The bottom wall of housing 16 is physically connected to the top surface of circuit board 12.

The housing 16 is shown formed with an insert molded lead frame. The housing 16 may be made of a dielectric material, such as plastic, with electrically conductive leads 30, 32 and 34 extending through the housing. Electrical lead 34 extends onto a terminal on the bottom side of electronic device 20, while electrical leads 30 and 32 are electrically coupled to conductive pads 40 and 42 on the top side of the electronic device 20. In the semiconductor transistor (e.g., FET/IGBT) embodiment, electrical lead 32 connects to the gate, electrical lead 30 connects to the source, and electrical lead 34 connects to the drain. The electrical leads 30, 32 and 34 are further coupled to other electrical circuits (not shown).

Formed in the bottom wall of housing 16 are an inlet port 44 and an outlet port 46 for passing cooling fluid through the sealed compartment. In fluid flow communication with inlet and outlet ports 44 and 46 are port fittings 50 and 60 extending through openings 52 and 62 in the substrate 12 and housing 14. Port fittings 50 and 60 may be metallic and each have an opening 54 and 64, respectively, extending therethrough for passing cooling fluid in communication with inlet and outlet ports 44 and 46, respectively.

The electronic device 20 is formed having a plurality of channels 26 formed in the semiconductor material (e.g., silicon). The channels 26 allow cooling fluid flowing in inlet port 44 to flow through the channels 26 and exit outlet port 46. The channels 26 may be formed by cutting into the semiconductor silicon of the electronic device 20. This may be achieved using a mechanical sawing process at the wafer level which generates significant cost savings over conventional silicon etching processes. The formation of channels 26 results in a plurality of parallel fins 24 that offer enhanced thermal energy transfer. According to one embodiment, channels 26 may have a width in the range of approximately 50 microns to 5,000 microns. The electronic device 20 has an opposite side that remains uncut 22 and which may include electrical circuitry as should be apparent to those skilled in the art.

Figure 1:
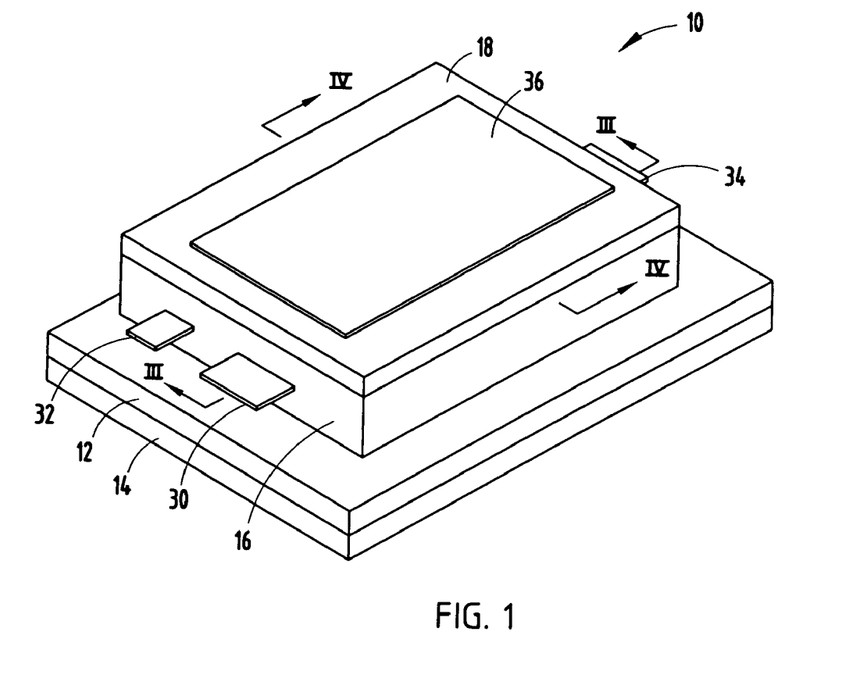
FIG. 1 is a perspective view of an electronic assembly employing fluid cooling according to a first embodiment of the present invention.
Figure 2:
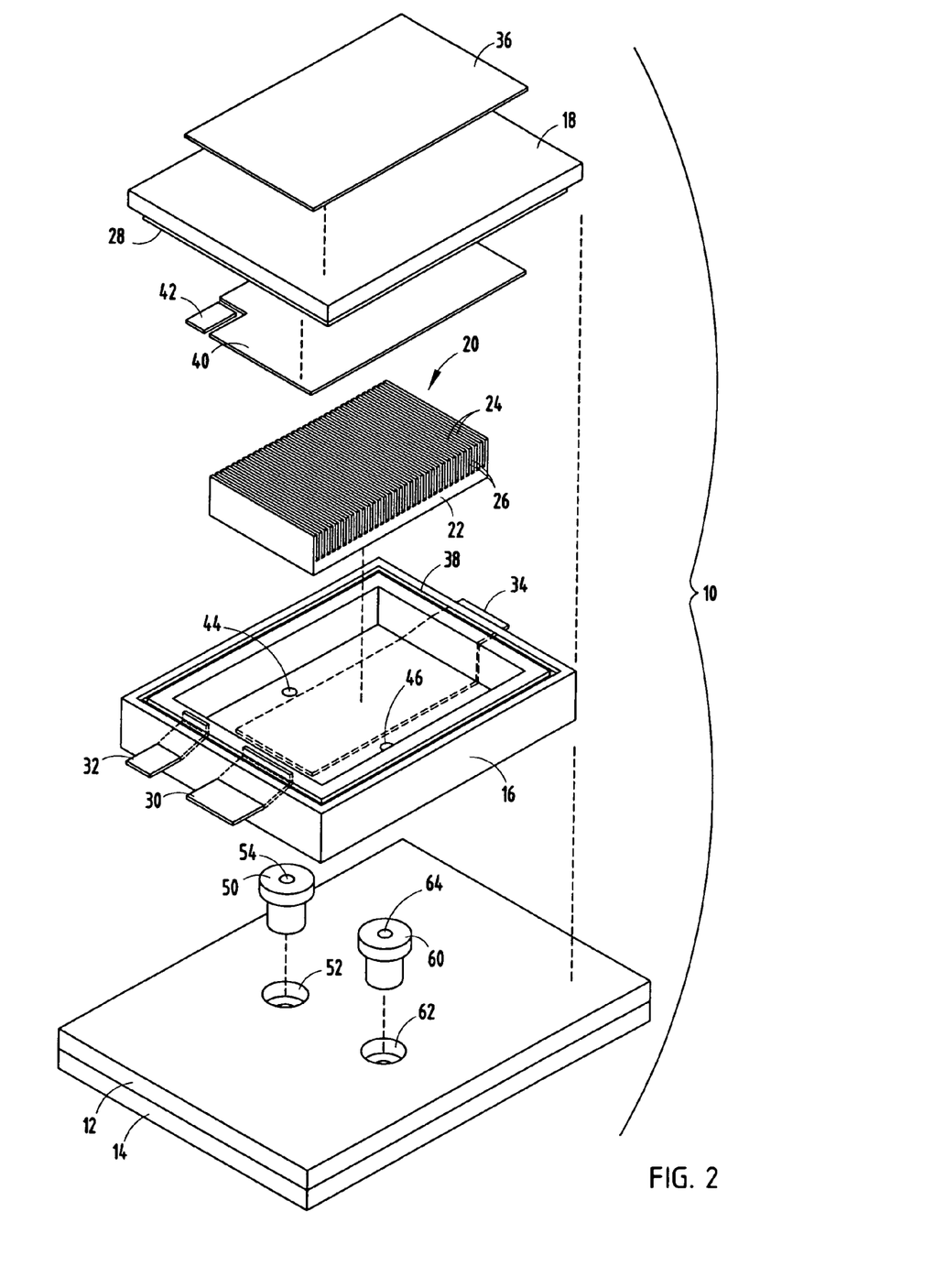
FIG. 2 is an exploded view of the electronic assembly of FIG. 1.
Figure 3:
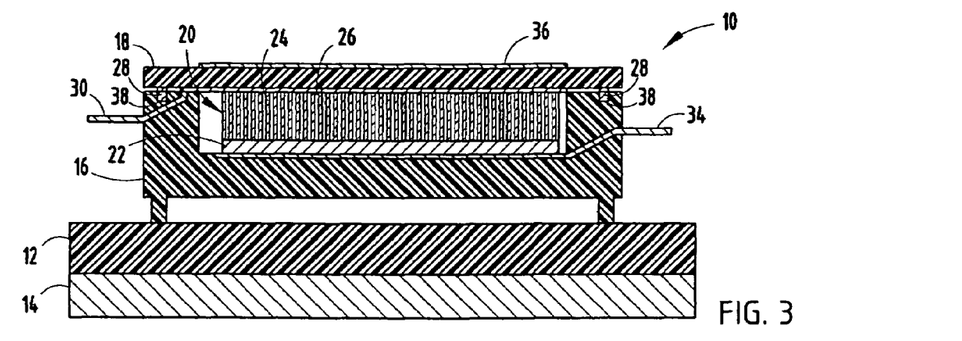
FIG. 3 is a cross-sectional view of the electronic assembly taken through line III-III of FIG. 1.
Figure 4:
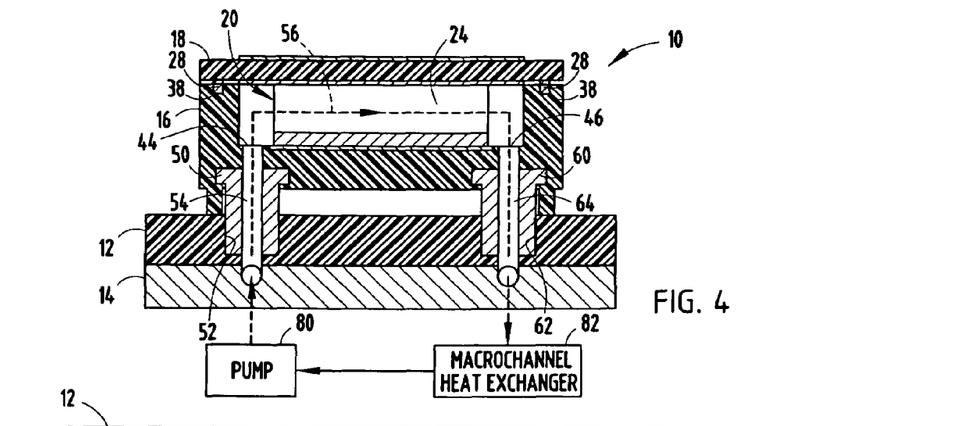
FIG. 4 is a cross-sectional view of the electronic assembly taken through line IV-IV of FIG. 1.
Figure 5:
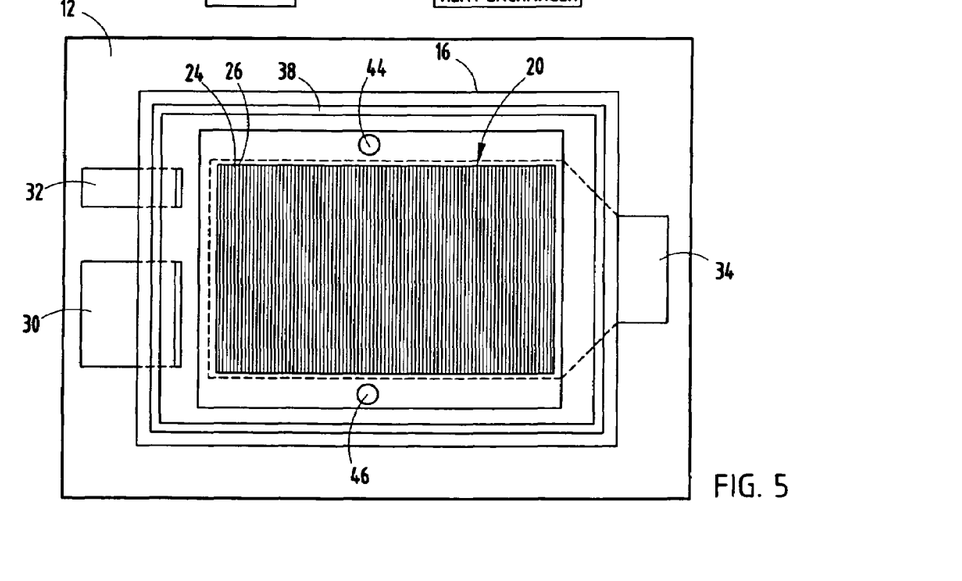
FIG. 5 is a top view of the electronic assembly of FIG. 1 with the cover removed.

With particular reference to FIG. 4, the flow of cooling liquid through the electronic assembly 10 is illustrated, according to one embodiment. The cooling liquid may include water, dielectric fluids such as fluorinerts, or silicone or hydrocarbon based cooling liquids in both single or two phase. Cooling liquid is pumped by a pump 80 into the inlet port 44 and forced to pass into the sealed compartment through channels 26 between fins 24 and exit the outlet port 46. In doing so, the liquid passes through flow path 56 and is heated as it passes in thermal communication with the higher temperature electronic device 20 during its normal operation. The heated liquid, upon exiting the electronic assembly 10, is passed through an external macrochannel heat exchanger 82 to cool the liquid before returning to pump 80. Any of a number of known heat exchangers 82 may be employed to cool the liquid in a closed path liquid cooling system.

Figure 6:
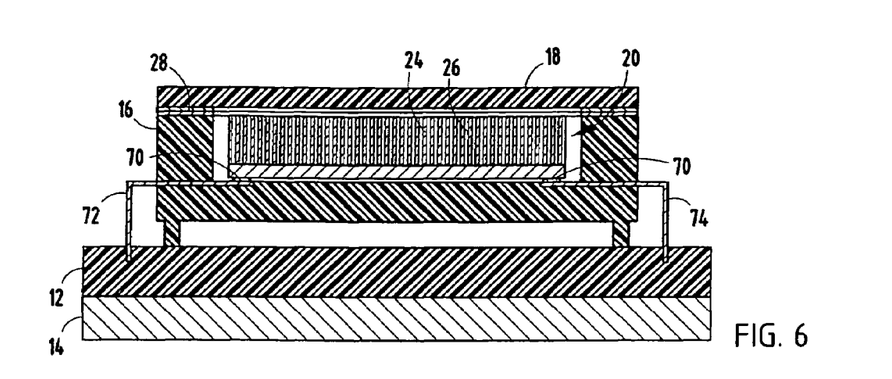
FIG. 6 is a cross-sectional view taken through an electronic assembly according to a second embodiment.

Referring to FIG. 6, an electronic assembly 10 is illustrated employing a flip chip semiconductor die/device as the electronic device 20, according to a second embodiment. The semiconductor device 20 likewise includes a plurality of channels 26 cut into silicon on one surface of the semiconductor flip chip 20. Cooling liquid passes into the sealed compartment and through the channels 26 as described in connection with the first embodiment to cool the flip chip device 20. The flip chip device 20 has electrical contact pads formed on the bottom side thereof which are soldered via solder connections 70 to electrical leads 72 and 74. Electrical leads 72 and 74, in turn, are connected to circuit board 12 to complete desired electrical circuit paths.

Figure 7:
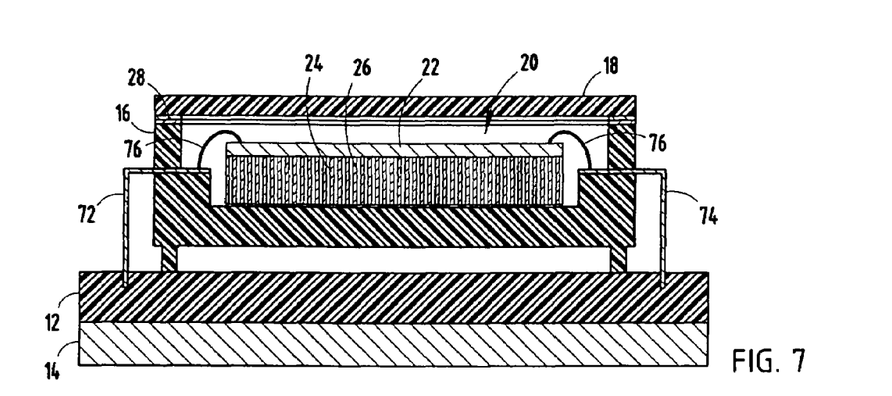
FIG. 7 is a cross-sectional view taken through an electronic assembly according to a third embodiment.

Referring to FIG. 7, a semiconductor die/device 20 is shown in an electronic assembly 10 according to a third embodiment employing wire bond connections. In this embodiment, the semiconductor die/device 20 is positioned upside-down as compared to the embodiment disclosed in FIG. 6. A plurality of wire bonds 76 connect electrical circuit contact pads on the surface of die/device 20 to the electrical leads 72 and 74, which in turn, are connected to electrical circuitry on the printed circuit board 12. In this embodiment, the die/device 20 is positioned such that the channels 26 extend downward, and the cooling liquid flows into the sealed compartment and between the channels 26 to cool the flip chip semiconductor device 20.

Figure 8:
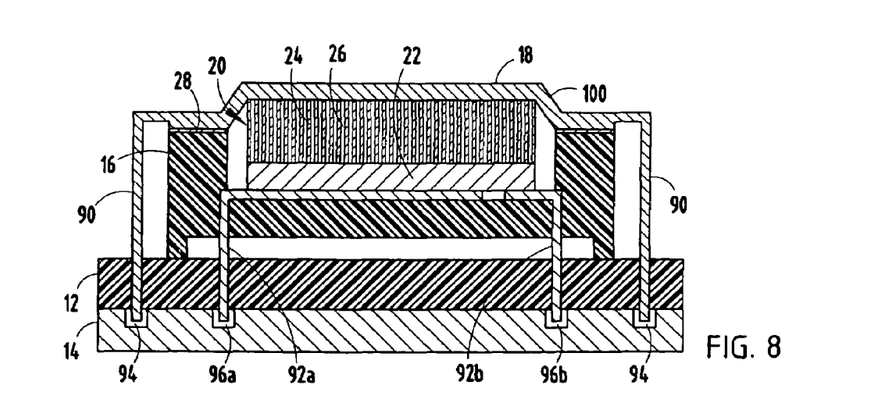
FIG. 8 is a cross-sectional view taken through an electronic assembly according to a fourth embodiment.

Referring to FIG. 8, a fourth embodiment of the electronic assembly 10 is illustrated employing an FET/IGBT die/device 20. In this embodiment, the cover 18 is electrically conductive and contacts the upper surface of the electronic device 10. The cover 18 has integrally formed electrically conductive leads 90 that extend through circuit board 12 to provide electrical circuit connections to electrical circuitry on circuit board 12 and is electrically isolated from housing 14 by isolation regions 94 on circuit board 12. The conductive cover 18 has an outward protruding portion 100 that accommodates the height of the die/device 20 relative to the housing 16. In this FET/IGBT device embodiment, the electrically conductive cover 18 and leads 90 provide the source terminal connections. The bottom surface of the electronic device 20 is in electrical contact with leads 92*a* and 92*b*, which extend down through circuit board 12 and form electrical connections to circuitry on circuit board 12 which is electrically isolated from housing 14 by isolation regions 96*a* and 96*b*, respectively. In this embodiment, the cooling liquid likewise passes into the sealed compartment and through channels 26 to cool the electronic device 20.

Figure 9:
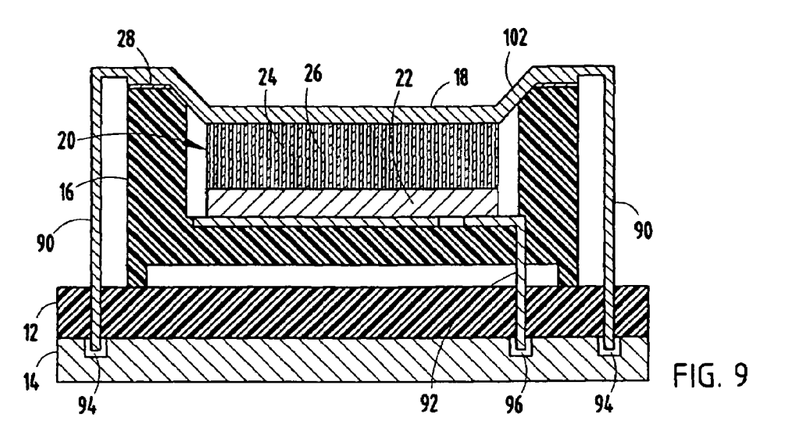
FIG. 9 is a cross-sectional view taken through an electronic assembly according to a fifth embodiment.

Referring to FIG. 9, an electronic assembly 10 is illustrated according to a fifth embodiment. In this embodiment, the electronic device 20 is an FET/IGBT die/device configured similar to the package in FIG. 8, except the housing 16 has side walls that extend above the height of the electronic device 20 so as to provide additional protection to the device 20. Additionally, the conductive cover 18 has an inward protruding recessed portion 102 to accommodate the height variation. In this embodiment, the electrically conductive cover 18 jogs up and over the upper end of housing 16 and its integrally formed leads 90 serve to provide an electrical connection to circuitry on circuit board 12 which is electrically isolated from housing 14 by isolation regions 94. Cooling liquid likewise flows into the sealed compartment and through the channels 26 to cool the die/device 20.

Figure 10:
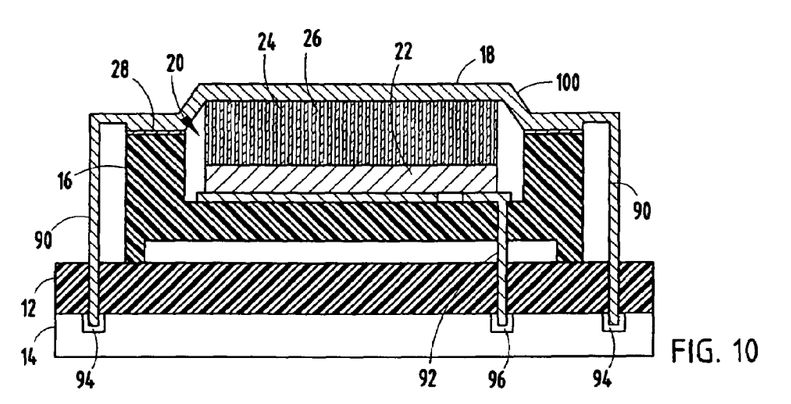
FIG. 10 is a cross-sectional view taken through an electronic assembly according to a sixth embodiment.

Referring to FIG. 10, an electronic assembly 10 is illustrated according to a sixth embodiment employing an FET/IGBT die/device 20 that extends above the height of the housing 16. The conductive cover 18 has an outward protruding portion 100 to accommodate the height of the die/device 20. Additionally, the bottom surface of the electronic device 20 is electrically coupled to lead 92 which connects to circuitry on circuit board 12 which is electrically isolated from housing 14 by isolation regions 96. The remaining surface of the bottom side of the device 20 may be electrically coupled through the metallic coupler port (such as 50) to provide an integrated electrically connection to circuitry on the circuit board 12. Cooling liquid flows into the sealed compartment and through channels 26 to cool the device 20.

Figure 11:
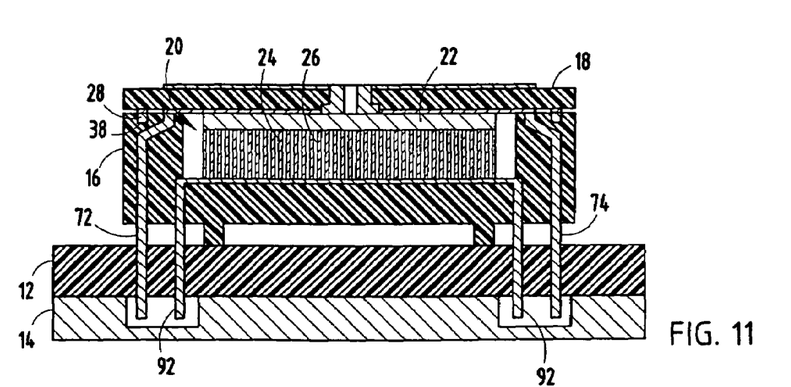
FIG. 11 is a cross-sectional view taken through an electronic assembly according to a seventh embodiment.

Referring to FIG. 11, an electronic assembly 10 is illustrated according to the seventh embodiment employing an FET/IGBT die/device 20. The die/device 20 on its bottom side is connected to electrical leads 92 that provide the drain connection. The upper surface of the electronic device 20 is electrically coupled to lead 72 to form the source and also to lead 74 to form the gate of the transistor device 20. Leads 72, 74 and 92 may be connected to circuitry on circuit board 12 which is electrically isolated from housing 14 by isolation regions. Similar to all embodiments described above, cooling liquid flows into the sealed compartment and through the channels 26 to cool the package 20.

Accordingly, the electronic assembly 10 of the present invention advantageously provides for enhanced cooling of an electronic device 20 mounted to a substrate 12. The liquid cooling achieved by way of the channels 26 formed on the electronic device 20 to allow liquid coolant to pass therethrough. The liquid advantageously exchanges heat to remove heat from the electronic device 20 and transfers the heat to the outside environment. By enhancing the heat dissipation, particularly for high-powered electronic devices, the electronic assembly 10 advantageously allows for the reduction in the number and/or size of electronic device(s) used in the assembly 10, thereby reducing the size and cost of the overall assembly 10. Additionally, the enhanced heat dissipation achieved by employing the liquid cooling of the present invention may allow for an increase of power output of the electronic device 20 and the circuit board 12, thereby improving the overall performance of the electronic assembly 10. These and other advantages may be achieved by the novel assembly in cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronic assembly having thermal cooling fluid comprising:
    a housing generally defining a sealed fluid compartment;
    an electronic device disposed within the sealed fluid compartment in the housing, wherein the electronic device comprises a semiconductor material;
    an inlet port including a first sealed coupler in fluid communication with the sealed fluid compartment for receiving a cooling fluid;
    an outlet port including a second sealed coupler in fluid communication with the sealed fluid compartment for passing the cooling fluid out of the housing a circuit board comprising a substrate having electrical circuitry, wherein the electronic device is mounted to the circuit board and the circuit board comprises first and second openings, wherein the electric device is connected to the circuit board and, wherein the first and second sealed couplers are in fluid communication with the first and second openings of the circuit board; and
    fluid flow channels defined by at least one surface of the electronic device such that fluid in the fluid flow channels is in fluid communication with the electronic device within the housing, said fluid flow channels allowing fluid to flow from the inlet port through the fluid flow channels and to the outlet port such that the fluid is forced to pass into the sealed compartment and through the fluid flow channels in fluid communication with the electronic device to cool the electronic device and exit out the outlet port.

2. The electronic assembly as defined in claim 1, wherein the fluid flow channels comprise a plurality of channels formed in the semiconductor material on at least one surface of the electronic device.

3. The electronic assembly as defined in claim 2, wherein the electronic device comprises silicon and the plurality of channels are formed in the silicon via a mechanical sawing process.

4. The electronic assembly as defined in claim 1, wherein the electronic device comprises a semiconductor device.

5. The electronic assembly as defined in claim 1, wherein the cooling fluid comprises liquid.

6. The electronic assembly as defined in claim 1 further comprising an external heat exchanger for cooling the fluid passing out of the outlet port, said external heat exchanger supplying cooled fluid to the inlet port.

7. The electronic assembly as defined in claim 1, wherein the assembly is employed on an automotive vehicle.

8. The electronic assembly as defined in claim 1, wherein the housing comprises side walls and a lid sealed to the side walls.

9. The electronic assembly as defined in claim 1, wherein the electronic device comprises at least one of a flip chip, an IGBT and a FET.

10. An electronic assembly having thermal cooling liquid comprising:
- a housing generally defining a sealed compartment;
- an electronic device disposed within the sealed compartment in the housing, wherein the electronic device comprises a semiconductor material;
- a cooling liquid adapted to pass through the sealed compartment in thermal communication with the electronic device to cool the electronic device;
- an inlet port including a first sealed coupler in fluid communication with the sealed compartment for receiving the cooling liquid;
- an outlet port including a second sealed coupler in fluid communication with the sealed compartment for passing the cooling liquid out of the housing a circuit board comprising a substrate having electrical circuitry, wherein the electronic device is mounted to the circuit board and the circuit board comprises first and second openings, wherein the electronic device is connected to the circuit board and, wherein the first and second sealed couplers are in; and fluid flow channels defined by at least one surface of the electronic device such that the liquid is in fluid communication with the electronic device the housing, said fluid flow channels allowing the cooling liquid to flow from the inlet port through the fluid flow channels and to the outlet port such that the liquid is forced to pass into the sealed compartment and through the fluid flow channels in fluid communication with the electronic device to cool the electronic device and out the outlet port.

11. The electronic assembly as defined in claim 10, wherein the fluid flow channels comprise a plurality of channels formed on at least one surface of the electronic device.

12. The electronic assembly as defined in claim 11, wherein the electronic device comprises silicon and the plurality of channels are formed in the silicon via a mechanical sawing process.

13. The electronic assembly as defined in claim 11, wherein the electronic device comprises a semiconductor device comprising silicon, and wherein said channels are formed in said silicon.

14. The electronic assembly as defined in claim 10 further comprising an external heat exchange device for cooling the liquid passing out of the outlet port, said external heat exchanger device supplying cooled liquid to the inlet port.

15. The electronic assembly as defined in claim 10, wherein the assembly is employed on an automotive vehicle.

16. The electronic assembly as defined in claim 10, wherein the housing comprises side walls and a lid sealed to the side walls.

17. The electronic assembly as defined in claim 10, wherein the electronic device comprises at least one of a flip chip, an IGBT and an FET.

* * * * *